(12) United States Patent
Endo et al.

(10) Patent No.: US 10,025,327 B2
(45) Date of Patent: Jul. 17, 2018

(54) DATA CENTER

(71) Applicant: FUJITSU LIMITED, Kawasaki-shi, Kanagawa (JP)

(72) Inventors: Hiroshi Endo, Isehara (JP); Masatoshi Ogawa, Isehara (JP); Shigeyoshi Umemiya, Fujisawa (JP); Shino Tokuyo, Sagamihara (JP); Hiroyuki Fukuda, Tokohama (JP)

(73) Assignee: FUJITSU LIMITED, Kawasaki (JP)

( * ) Notice: Subject to any disclaimer, the term of this patent is extended or adjusted under 35 U.S.C. 154(b) by 290 days.

(21) Appl. No.: 14/620,716

(22) Filed: Feb. 12, 2015

(65) Prior Publication Data
US 2015/0245541 A1    Aug. 27, 2015

(30) Foreign Application Priority Data

Feb. 25, 2014    (JP) .................................. 2014-033691

(51) Int. Cl.
G05D 23/13    (2006.01)
H05K 7/20    (2006.01)
G05D 27/02    (2006.01)

(52) U.S. Cl.
CPC ......... *G05D 23/1393* (2013.01); *G05D 27/02* (2013.01); *H05K 7/20745* (2013.01); *H05K 7/20754* (2013.01); *H05K 7/20836* (2013.01)

(58) Field of Classification Search
CPC ...... G05F 1/66; G05D 23/1393; G05D 27/02; H05K 7/20745; H05K 7/20836; H05K 7/20754

(Continued)

(56) References Cited

U.S. PATENT DOCUMENTS 7,064,994 B1 *  6/2006  Wu .......................... G06F 1/206
                                                    365/211
7,352,641 B1 *  4/2008  Wu .......................... G06F 1/206
                                                    365/211

(Continued)

FOREIGN PATENT DOCUMENTS

JP    S61-225897       10/1986
JP    2013-104639 A1    5/2013

(Continued)

OTHER PUBLICATIONS

Japanese Office Action dated Aug. 22, 2017 for corresponding Japanese Patent Application No. 2014-033691 with Full-Length English Machine Translation.

*Primary Examiner* — Kenneth M Lo
*Assistant Examiner* — Mohammed Shafayet
(74) *Attorney, Agent, or Firm* — Kratz, Quintos & Hanson, LLP

(57) ABSTRACT

A data center includes: a structure provided with an intake port at one side thereof and an exhaust port at the other side thereof; a rack disposed in the structure; an air blower configured to introduce outside air into the structure through the intake port to circulate the outside air from one side to the other side of the rack; a circulation passage configured to make a first space between the one side of the rack and the intake port and a second space between the other side of the rack and the exhaust port communicate with each other; a circulation amount control equipment disposed within the circulation passage; and an air circulation amount control device configured to control the circulation amount control equipment and an operation state of the electronic equipment such that the amount of the air which circulates the circulation passage is adjusted.

4 Claims, 13 Drawing Sheets

(58) Field of Classification Search
USPC .................................................. 700/282, 278
See application file for complete search history.

(56) References Cited

U.S. PATENT DOCUMENTS

| | | | | |
|---|---|---|---|---|
| 8,346,398 B2* | 1/2013 | Ahmed | ................... | G06F 1/206 700/278 |
| 8,662,943 B2* | 3/2014 | Conroy | ..................... | G06F 1/26 439/894 |
| 8,676,397 B2* | 3/2014 | Longobardi | ......... | G05B 13/048 165/201 |
| 8,885,335 B2* | 11/2014 | Magarelli | ............... | G06F 1/206 361/679.47 |
| 8,914,155 B1* | 12/2014 | Shah | .................. | H05K 7/20745 700/19 |
| 9,043,035 B2* | 5/2015 | Chainer | ............... | G05D 7/0635 361/696 |
| 9,541,971 B2* | 1/2017 | Haridass | ................ | G06F 1/206 |
| 2004/0260957 A1* | 12/2004 | Jeddeloh | ................ | G06F 1/206 713/300 |
| 2005/0170770 A1* | 8/2005 | Johnson | ............. | H05K 7/20836 454/184 |
| 2006/0091229 A1* | 5/2006 | Bash | .................... | F24F 11/0012 236/49.3 |
| 2009/0044027 A1* | 2/2009 | Piazza | ................... | G06F 1/3203 713/300 |
| 2009/0077558 A1* | 3/2009 | Arakawa | ................ | G06F 1/206 718/102 |
| 2009/0150129 A1* | 6/2009 | Archibald | ................ | G06F 1/20 703/5 |
| 2009/0210096 A1* | 8/2009 | Stack | ................... | F24F 11/0009 700/278 |
| 2009/0326721 A1* | 12/2009 | Sugiyama | ............ | F24F 11/0001 700/282 |
| 2011/0060470 A1* | 3/2011 | Campbell | .......... | G05D 23/1934 700/282 |
| 2011/0071687 A1* | 3/2011 | Uraki | ................... | F24F 11/0079 700/278 |
| 2011/0161712 A1* | 6/2011 | Athalye | .................. | G06F 1/206 713/340 |
| 2011/0245981 A1* | 10/2011 | Refai-Ahmed | ......... | G06F 1/206 700/282 |
| 2011/0303406 A1* | 12/2011 | Takeda | ............... | H05K 7/20836 165/288 |
| 2011/0306288 A1* | 12/2011 | Murayama | ........... | F24F 11/0001 454/184 |
| 2012/0010754 A1* | 1/2012 | Matteson | ........... | H05K 7/20836 700/282 |
| 2012/0116590 A1* | 5/2012 | Florez-Larrahondo | . | G06F 1/206 700/275 |
| 2012/0123595 A1* | 5/2012 | Bower, III | ......... | G05D 23/1934 700/282 |
| 2012/0215359 A1* | 8/2012 | Michael | ................... | G06F 1/206 700/275 |
| 2013/0010423 A1* | 1/2013 | Carlson | .............. | H05K 7/20827 361/679.47 |
| 2013/0073096 A1* | 3/2013 | Brey | ...................... | G05B 13/02 700/282 |
| 2013/0098593 A1* | 4/2013 | Busch | ................ | H05K 7/20209 165/200 |
| 2013/0178999 A1* | 7/2013 | Geissler | ............. | H05K 7/20836 700/300 |
| 2013/0299157 A1* | 11/2013 | Murayama | ......... | H05K 7/20745 165/224 |
| 2014/0052276 A1* | 2/2014 | Krishnapura | ............ | G06F 1/26 700/1 |
| 2014/0078663 A1* | 3/2014 | Xu | ........................... | G06F 1/20 361/679.32 |
| 2014/0104784 A1* | 4/2014 | Chen | ....................... | G06F 1/206 361/679.47 |
| 2014/0240913 A1* | 8/2014 | Vyshetsky | ............... | G06F 1/206 361/679.31 |
| 2014/0259966 A1* | 9/2014 | Totani | ................ | H05K 7/20136 52/1 |
| 2014/0349563 A1 | 11/2014 | Honda et al. | | |
| 2015/0011148 A1* | 1/2015 | Zwinkels | ........... | H05K 7/20745 454/184 |
| 2015/0016056 A1 | 1/2015 | Endo et al. | | |
| 2016/0062421 A1* | 3/2016 | Sugawara | ............... | G06F 1/206 700/299 |
| 2016/0170919 A1* | 6/2016 | Blagodurov | ........ | G06F 13/1694 711/154 |

FOREIGN PATENT DOCUMENTS

JP  2013-148254 A  8/2013
WO  2013/150583 A1  10/2013

* cited by examiner

FIG. 4

| DATA NUMBER | OPERATION STATE x (kW) | INTAKE AIR TEMPERATURE $T_2$ (°C) | REQUIRED AMOUNT OF AIR $Q_1(T_2)$ (m³/hr) |
|---|---|---|---|
| No. 1 | 20 | 16 | 4000 |
| No. 2 | 20 | 20 | 6000 |
| No. 3 | 20 | 24 | 8000 |
| No. 4 | 20 | 28 | 10000 |
| No. 5 | 10 | 16 | 4000 |
| No. 6 | 10 | 20 | 4000 |
| ⋮ | ⋮ | ⋮ | ⋮ |

FIG. 6

| DATA NUMBER | OPERATION STATE POWER x(kW) | INTAKE AIR TEMPERATURE $T_2$(°C) | REQUIRED AIR AMOUNT $Q_1(T_2)$ (m$^3$/hr) |
|---|---|---|---|
| No. 1 | 10 | 20 | 1000 |
| No. 2 | | 21 | 1000 |
| No. 3 | | 22 | 1000 |
| No. 4 | | 23 | 1000 |
| No. 5 | | 24 | 1000 |
| No. 6 | | 25 | 1000 |
| No. 7 | | 26 | 1250 |
| No. 8 | | 27 | 1500 |
| No. 9 | | 28 | 1750 |
| No. 10 | | 29 | 2000 |
| No. 11 | | 30 | 2250 |
| No. 12 | | 31 | 2500 |
| No. 13 | | 32 | 2750 |
| No. 14 | | 33 | 3000 |
| No. 15 | | 34 | 3250 |
| No. 16 | | 35 | 3250 |
| No. 17 | 20 | 20 | 1000 |
| No. 18 | | 21 | 1000 |
| No. 19 | | 22 | 1000 |
| No. 20 | | 23 | 1250 |
| No. 21 | | 24 | 1500 |
| No. 22 | | 25 | 1750 |
| No. 23 | | 26 | 2000 |
| No. 24 | | 27 | 2250 |

FIG. 7

| DATA NUMBER | OPERATION STATE POWER x(kW) | INTAKE AIR TEMPERATURE $T_2$(°C) | REQUIRED AIR AMOUNT $Q_1(T_2)$ (m³/hr) |
|---|---|---|---|
| No. 25 | 20 | 28 | 2500 |
| No. 26 | | 29 | 2750 |
| No. 27 | | 30 | 3000 |
| No. 28 | | 31 | 3250 |
| No. 29 | | 32 | 3250 |
| No. 30 | | 33 | 3250 |
| No. 31 | | 34 | 3250 |
| No. 32 | | 35 | 3250 |
| No. 33 | 30 | 20 | 1000 |
| No. 34 | | 21 | 1250 |
| No. 35 | | 22 | 1500 |
| No. 36 | | 23 | 1750 |
| No. 37 | | 24 | 2000 |
| No. 38 | | 25 | 2250 |
| No. 39 | | 26 | 2500 |
| No. 40 | | 27 | 2750 |
| No. 41 | | 28 | 3000 |
| No. 42 | | 29 | 3250 |
| No. 43 | | 30 | 3250 |
| No. 44 | | 31 | 3250 |
| No. 45 | | 32 | 3250 |
| No. 46 | | 33 | 3250 |
| No. 47 | | 34 | 3250 |
| No. 48 | | 35 | 3250 |

FIG. 8

| DATA NUMBER | OUTSIDE AIR TEMPERATURE $T_1$(°C) | INTAKE AIR TEMPERATURE $T_2$(°C) | REQUIRED AIR AMOUNT $Q_1(T_2)$ (m³/hr) | INTAKE AIR TEMPERATURE $Q_2(T_2)$ (m³/hr) | REQUIRED AIR AMOUNT $Q_3(T_2)$ (m³/hr) |
|---|---|---|---|---|---|
| 10 | 20 | 20 | 1000 | 1000 | 0 |
| | | 21 | 1000 | 940 | 60 |
| | | 22 | 1000 | 880 | 120 |
| | | 23 | 1000 | 840 | 160 |
| | | 24 | 1000 | 790 | 210 |
| | | 25 | 1000 | 750 | 250 |
| | | 26 | 1250 | 840 | 410 |
| | | 27 | 1500 | 890 | 610 |
| | | 28 | 1750 | 910 | 840 |
| | | 29 | 2000 | 920 | 1080 |
| | | 30 | 2250 | 910 | 1340 |
| | | 31 | 2500 | 890 | 1610 |
| | | 32 | 2750 | 870 | 1880 |
| | | 33 | 3000 | 840 | 2160 |
| | | 34 | 3250 | 810 | 2440 |
| | | 35 | 3250 | 770 | 2480 |

FIG. 12

| DATA NUMBER | OPERATION STATE x (kW) | INTAKE AIR TEMPERATURE $T_2$ (°C) | REQUIRED FAN ROTATION NUMBER $R_1(T_2)$ (rpm) |
|---|---|---|---|
| No. 1 | 20 | 16 | 3500 |
| No. 2 | 20 | 20 | 5300 |
| No. 3 | 20 | 24 | 7700 |
| No. 4 | 20 | 28 | 9200 |
| No. 5 | 10 | 16 | 3500 |
| No. 6 | 10 | 20 | 3500 |
| ⋮ | ⋮ | ⋮ | ⋮ |

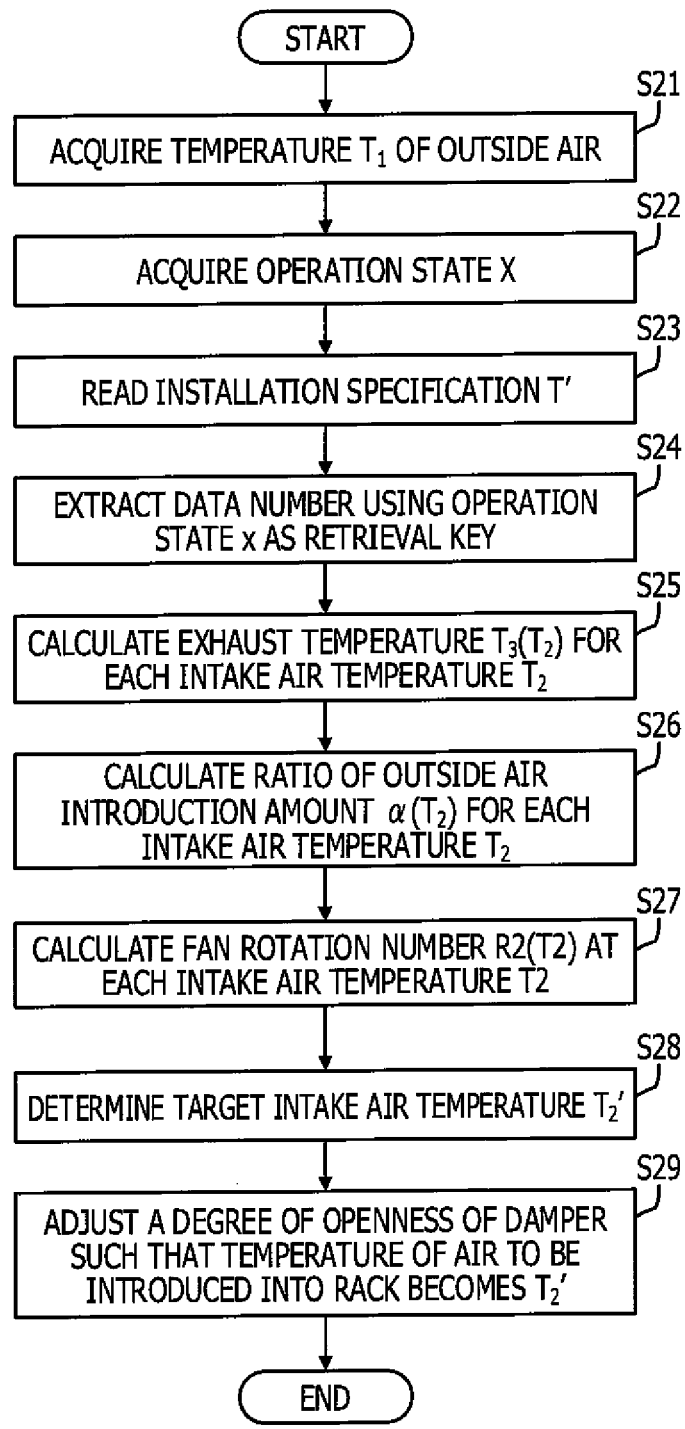

DATA CENTER

CROSS-REFERENCE TO RELATED APPLICATION

This application is based upon and claims the benefit of priority of the prior Japanese Patent Application No. 2014-033691 filed on Feb. 25, 2014, the entire contents of which are incorporated herein by reference.

FIELD

The embodiments discussed herein are related to a data center.

BACKGROUND

As the network technology is improved, a network service which provides various services to users via a network has come to draw attention. A service provider who provides services prepares, for example, a platform for executing a software package or application software in a data center.

In a data center, a plurality of racks is installed in a room and a plurality of servers is accommodated in each rack. Jobs are organically distributed to each server according to the operation states of the servers and as a result, a large number of jobs are efficiently processed.

In the meantime, servers generate a large amount of heat as they operate. Since the increase of the temperature of the servers may cause deterioration in performance or a malfunction, or becomes the cause of a failure, cold air is taken into the rack using a cooling fan and the heat generated within the rack is discharged to the outside of the rack.

In the meantime, a large amount of electric power is consumed in the data center, and thus, reduction of power consumption is required from the view point of saving energy. A general data center is configured such that the outside air is not allowed to infiltrate into the room in which the rack is installed and the temperature of the air supplied into the rack is adjusted using an air conditioner.

With respect to the data center, an electric power saving data center has been developed in which the servers are cooled down by using the outside air. Especially, in a data center directly cooled down by the outside air by directly introducing the outside air into the room, the electric power consumed in cooling down the servers may be substantially reduced compared to a general data center having no such features.

The following are reference documents:
[Document 1] Japanese Laid-Open Patent Publication No. 61-225897 and
[Document 2] Japanese Laid-Open Patent Publication No. 2013-104639.

SUMMARY

According to an aspect of the invention, a data center includes: a structure provided with an intake port at one side thereof and an exhaust port at the other side thereof; a rack disposed in the structure and configured to accommodate an electronic equipment; an air blower configured to introduce outside air into the structure through the intake port to circulate the outside air from one side to the other side of the rack; a circulation passage disposed above the rack and configured to make a first space between the one side of the rack and the intake port and a second space between the other side of the rack and the exhaust port communicate with each other; a circulation amount control equipment disposed within the circulation passage; and an air circulation amount control device configured to control the circulation amount control equipment according to a temperature of the outside air and an operation state of the electronic equipment such that the amount of the air which circulates the circulation passage is adjusted.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a table illustrating data stored in a required amount air storing unit;

FIG. 6 is a first table illustrating results obtained by calculating required amount of air $Q_1(T_2)$;

FIG. 7 is a second table illustrating the results obtained by calculating the required amount of air $Q_1(T_2)$;

FIG. 8 is a table illustrating results obtained by calculating the outside air introduction amount $Q_2(T_2)$ and circulation air amount $Q_3(T_2)$;

FIG. 12 is a table illustrating a required fan rotation number storing unit; and FIG. 13 is another flowchart illustrating the detailed operations of the air circulation amount control device.

DESCRIPTION OF EMBODIMENTS

Hereinafter, descriptions will be made on preliminary matters for making it to easy to understand embodiments before descriptions are made on the embodiment.

As described above, in the data center that is directly cooled down by the outside air, electric power consumed in cooling down the servers may be substantially reduced compared to a data center where the room temperature is controlled by an air conditioner. However, when the outside air is introduced into the room as it is, the servers or other electronic equipment may be injured due to, for example, a corrosive gas, dusts or sea salt particles contained in the outside air. Therefore, the outside air is introduced into the room through a filter in the data center that is directly cooled down by the outside air.

However, since the filters are clogged as the data center operates, these filters need to be replaced or cleaned appropriately. In the meantime, the servers are stopped during the filter replacement or filter cleaning and thus, an operating rate of the servers is reduced.

In the following embodiment, descriptions will be made on a data center in which an operating rate of a server (electronic equipment) may be improved by optimizing an amount of the outside air to be introduced into the room and extending the time to clean or replace the filter.

(First Embodiment)

Figure 1:
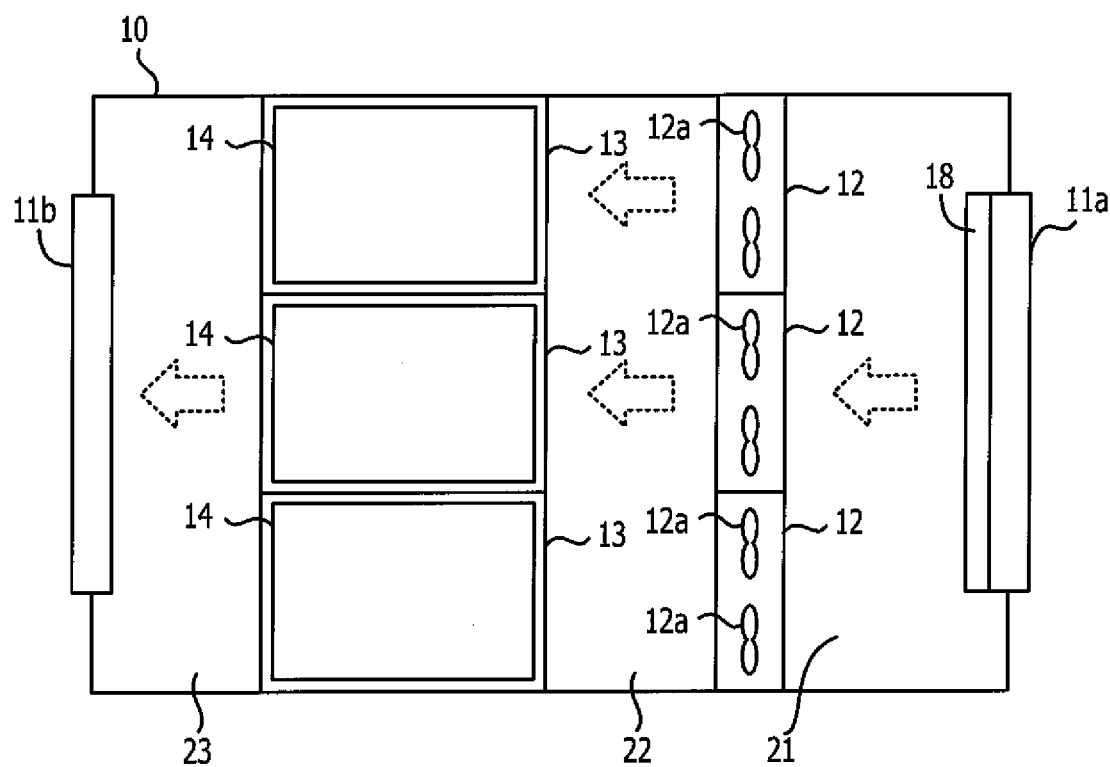
FIG. 1 is a schematic plan view illustrating a data center according to a first embodiment.
Figure 2:
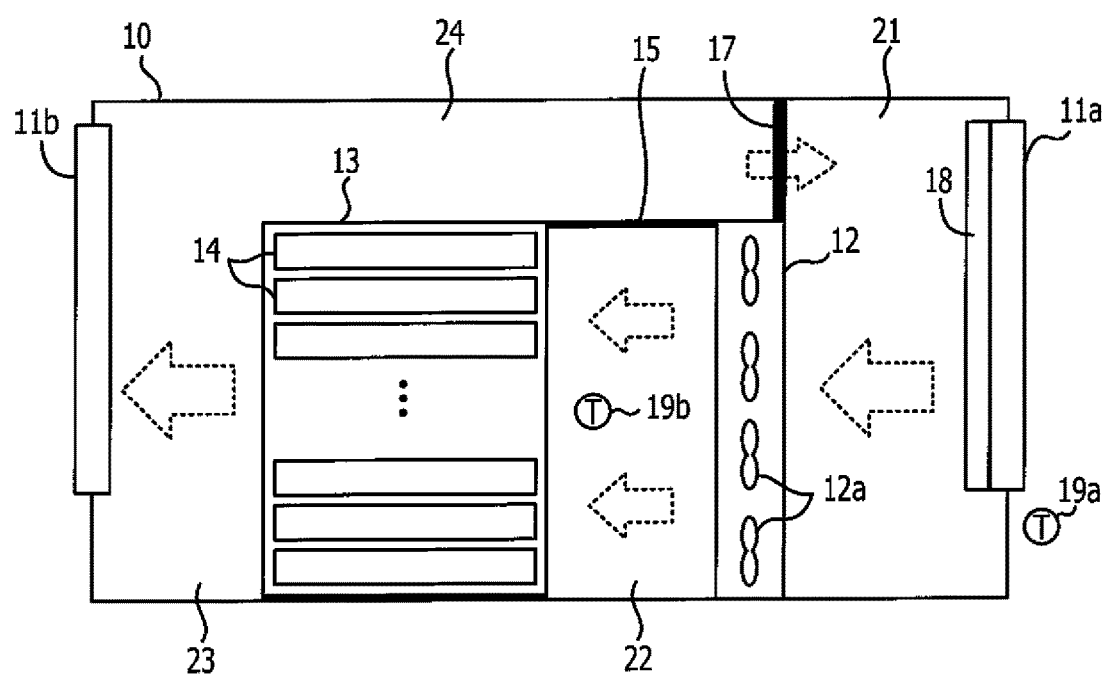
FIG. 2 is a schematic side view illustrating a data center according to a first embodiment.

FIG. 1 is a schematic plan view illustrating a data center according to a first embodiment and FIG. 2 is a schematic side view illustrating the data center.

The data center illustrated in FIG. 1 and FIG. 2 includes a rectangular parallelepiped container (structure) 10, and facility fan units 12 and racks 13 that are disposed within the container 10. A plurality of electronic equipments 14 are accommodated in each rack 13. Further, a plurality of cooling fans 12a is provided in each facility fan unit 12.

In the present embodiment, an electronic equipment 14 accommodated within the rack 13 is assumed as a server. However, a recording medium such as a hard disk drive (HDD) or an electronic equipment other than the recording medium may also be accommodated in the rack 13. Further, in FIG. 1 and FIG. 2, although an example in which three facility fan units 12 and three racks 13 are disposed in the container 10 is illustrated, the number of facility fan units 12 and the number of racks 13 are arbitrary. The facility fan unit 12 is an example of an air blower.

An intake port 11a is provided at one of the two sides of the container 10 facing each other and an exhaust port 11b is provided at the other one of the two sides. Further, a diaphragm 15 is disposed above a space between the facility fan unit 12 and the rack 13.

An infiltration preventing plate that prevents an infiltration of, for example, rainwater or an insect screen which prevents an intrusion of, for example, insects is provided at the intake port 11a and the exhaust port 11b. Further, the filter 18 is installed at the intake port 11a in order to remove, for example, a corrosive gas, dusts or sea salt particles contained in the outside air.

The space within the container 10 is divided into an outside air introduction unit 21, a cold aisle 22, a hot aisle 23 and a warm air circulation passage 24 by the facility fan unit 12, the rack 13 and the diaphragm 15.

The outside air introduction unit 21 corresponds to a space between the intake port 11a and the facility fan unit 12, the cold aisle 22 corresponds to a space between the facility fan unit 12 and the rack 13, and the hot aisle 23 corresponds to a space between the rack 13 and the exhaust port 11b. The rack 13 is disposed such that one side thereof facing the cold aisle 22 becomes an intake surface and the other side facing the hot aisle 23 becomes an exhaust surface.

The warm air circulation passage 24 corresponds to a space located above the rack 13 and the diaphragm 15 and makes the hot aisle 23 and the outside air introduction unit 21 communicate with each other. A damper 17 for adjusting the amount of warm air is provided at the warm air circulation passage 24. The damper 17 is driven by an air circulation amount control device 20, which will be described later, so that the degree of openness varies. The damper 17 is an example of a circulation amount control equipment.

In the present embodiment, as illustrated in FIG. 2, a temperature sensor 19a which measures the temperature of the outside air is disposed outside of the container 10. Further, a temperature sensor 19b which measures the temperature of the air introduced into the rack 13 is disposed in the cold aisle 22.

In the data center, when a cooling fan 12a of the facility fan unit 12 rotates, the outside air is introduced into the outside air introduction unit 21 through the intake port 11a and the filter 18. Also, the air introduced into the outside air introduction unit 21 moves to the cold aisle 22 through the facility fan unit 12, enters the rack 13 from the intake surface of the rack 13, and cools down respective electronic equipments 14 provided therein.

The warm air with an increased temperature by cooling down the electronic equipment 14 is discharged from an exhaust surface of the rack 13 to the hot aisle 23 and discharged from the exhaust port 11b to the outdoors.

When the temperature of the outside air is high, the damper 17 is closed such that the warm air is not allowed to move from the hot aisle 23 to the outside air introduction unit 21.

In the meantime, when the temperature of the outside air is low, as will be described later, the degree of openness of the damper 17 is adjusted according to the temperature of the outside air as well as an operation state of the electronic equipment 14. Accordingly, a portion of warm air is returned from the hot aisle 23 through the warm air circulation passage 24 to the outside air introduction unit 21 and thus, the temperature of the air introduced into the rack 13 increases.

Figure 3:
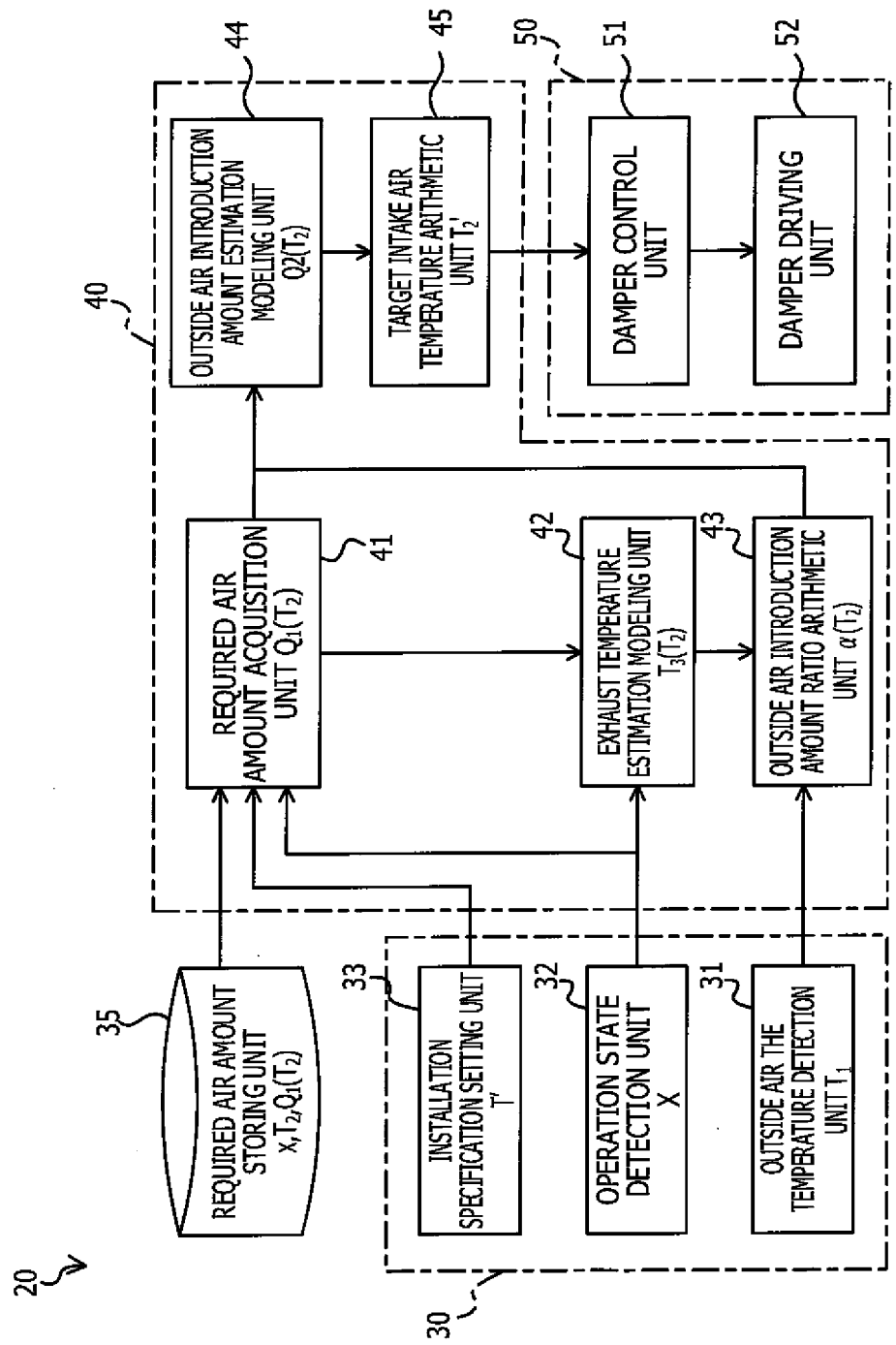
FIG. 3 is a block diagram illustrating a configuration of an air circulation amount control device.

FIG. 3 is a block diagram illustrating a configuration of an air circulation amount control device 20. Further, the air circulation amount control device 20 may be implemented by hardware and software. An exclusive device (computer) may be installed and the electronic equipment (server) 14 within the rack 13 may be utilized as hardware.

As illustrated in FIG. 3, the air circulation amount control device 20 utilized in the present embodiment includes an input unit 30, a required air amount storing unit 35, an arithmetic unit 40, and an output unit 50.

The input unit 30 includes an outside air temperature detection unit 31, an operation state detection unit 32, and an installation specification setting unit 33. The outside air temperature detection unit 31 acquires a temperature $T_1$ of the outside air from the temperature sensor 19a (see, for example, FIG. 2) installed an outside of the container 10.

The operation state detection unit 32 detects an operation state X of the electronic equipment 14 accommodated in the rack 13. In the present embodiment, a total p of power consumption (current power consumption) of the electronic equipments 14 accommodated in the rack 13 is used as the operation state X. Accordingly, the operation state detection unit 32 is configured to include a wattmeter which detects a total power consumption of the electronic equipments 14 accommodated in the rack 13.

Further, a value (X=p/P) obtained by dividing the total p of the power consumption (current power consumption) of the electronic equipments 14 accommodated in the rack 13 by a total P of rated powers of the electronic equipments 14 may be used as the operation state X. In this case, the operation state detection unit 32 is configured to include a wattmeter which detects a total power consumption p of the electronic equipments 14 accommodated in the rack 13 and a recording unit in which the total P of rated powers of the electronic equipments 14 accommodated in the rack 13 is recorded.

The installation specification T' of the electronic equipment 14 is set in the installation specification setting unit 33. Here, it is assumed that a suitable temperature range of air to be supplied to the electronic equipment 14 is set as the installation specification T'. In the present embodiment, the degree of openness of the damper 17 is set as a condition that the temperature of air introduced into the rack 13 satisfies the installation specification T'.

The data required for determining the temperature and the amount of air to be supplied to the rack 13 are stored in the required air amount storing unit 35. In the present embodiment, the operation state of the electronic equipment 14 is determined by using the power consumption as described above. In this case, as illustrated in FIG. 4, the data related to an operation state x, an intake air temperature $T_2$, and a required amount of air $Q_1(T_2)$ are stored in the required air amount storing unit 35 for each data number.

The operation state x is the total power consumptions of the electronic equipments 14 within the rack 13. Further, the intake air temperature $T_2$ is the temperature of the air to be introduced, that is, the temperature of the air within the cold aisle 22. Further, the required amount of air $Q_1(T_2)$ is the amount of air per unit time required for cooling down the electronic equipment 14 within the rack 13 when the temperature of the air is $T_2$. These data may be obtained from the specification of the electronic equipment 14 or from an experiment.

Further, although a small amount of data is listed in FIG. 4 in order to simplify the descriptions, a large amount of data is stored in an actual required air amount storing unit 35. For example, the operation state x is classified and stored every 1 kW to 5 kW, and the intake air temperature $T_2$ is classified and stored every 1° C. in a range spanning from 20° C. to 35° C.

The arithmetic unit 40 includes a required air amount acquisition unit 41, an exhaust air temperature estimation modeling unit 42, an outside air introduction amount ratio arithmetic unit 43, an outside air introduction amount estimation modeling unit 44, and a target intake air temperature arithmetic unit 45.

The required air amount acquisition unit 41 extracts a plurality of data numbers, that satisfies the installation specification T' and where the operation state x coincides with or nearly coincides with the operation state X detected by the operation state detection unit 32, from the data stored in the required air amount storing unit 35, as will be described later.

The exhaust air temperature estimation modeling unit 42 estimates the temperature of the air discharged from the rack 13, that is, the exhaust temperature $T_3$ ($T_2$), from the operation state X acquired from the operation state detection unit 32 and the required amount of air $Q_1(T_2)$ of the data number extracted from the required air amount acquisition unit 41.

The outside air introduction amount ratio arithmetic unit 43 calculates the ratio of outside air introduction amount $\alpha(T_2)$ using the temperature $T_1$ of outside air acquired from the outside air temperature detection unit 31 and the exhaust temperature $T_3(T_2)$ acquired from the exhaust air temperature estimation modeling unit 42.

The outside air introduction amount estimation modeling unit 44 determines the outside air introduction amount $Q_2(T_2)$ from the required amount of air $Q_1(T_2)$ extracted in the required air amount acquisition unit 41 and from the ratio of outside air introduction amount $\alpha(T_2)$ acquired from the outside air introduction amount ratio arithmetic unit 43.

The target intake air temperature arithmetic unit 45 calculates the target intake air temperature $T_2'$ from the outside air introduction amount $Q_2(T_2)$ determined in the outside air introduction amount estimation modeling unit 44.

The output unit 50 includes a damper control unit 51 and a damper driving unit 52. The damper control unit 51 adjusts the degree of openness of the damper 17 through the damper driving unit 52 so that the detection temperature of the temperature sensor 19b disposed in the cold aisle 22 becomes the target intake air temperature T'.

Figure 5:
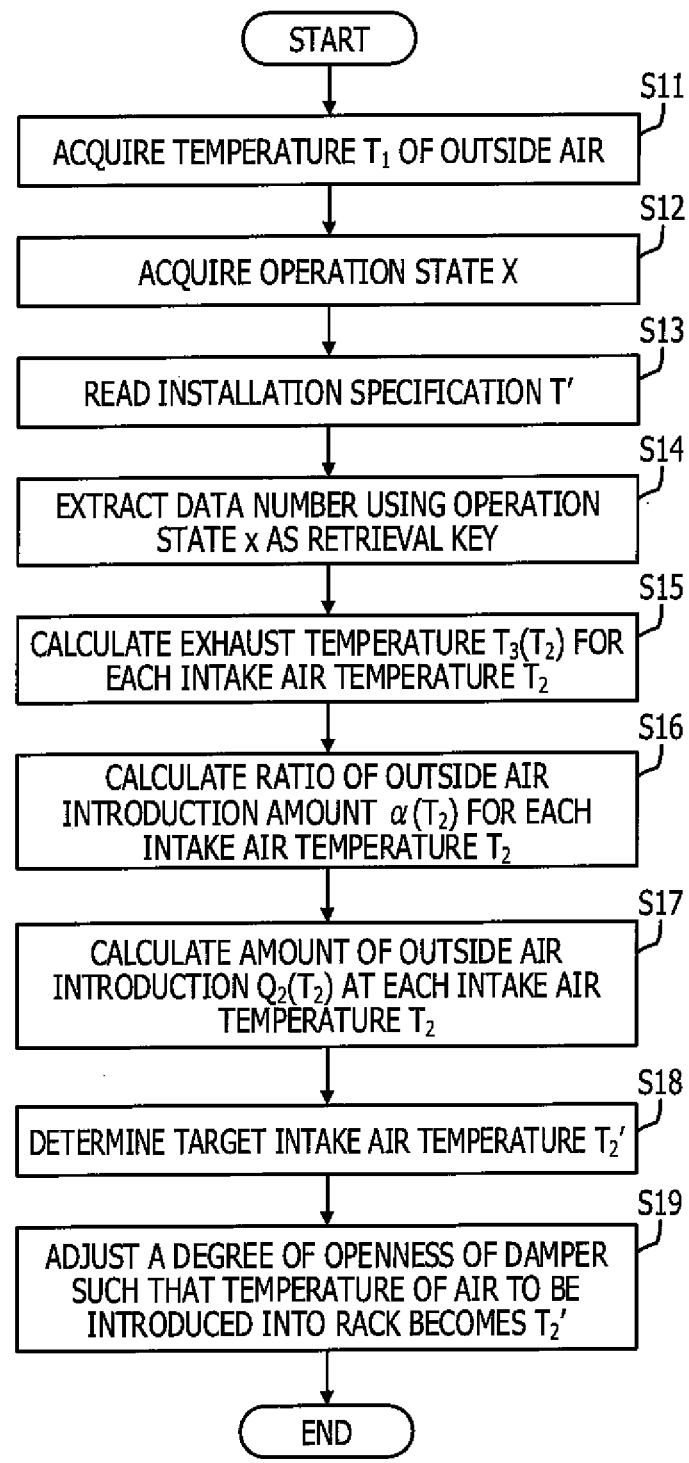
FIG. 5 is a flowchart illustrating the detailed operations of the air circulation amount control device.

Hereinafter, descriptions will be made on details of an operational process of the air circulation amount control device 20 with reference to a flowchart of FIG. 5.

First of all, at step S11, the outside air temperature detection unit 31 acquires the temperature $T_1$ of outside air from the temperature sensor 19a. Further, at step S12, the operation state detection unit 32 detects the operation state X of the electronic equipment 14.

Next, the process proceeds to step S13 and the required air amount acquisition unit 41 reads the installation specification T' of the electronic equipment 14 from the installation specification setting unit 33. As described above, the suitable temperature range of the air supplied to the electronic equipment 14 is stored in the installation specification setting unit 33 as the installation specification T'.

Next, the process proceeds to step S14 and the required air amount acquisition unit 41 acquires the operation state X from the operation state detection unit 32 and extracts the data number in which the operation state x coincides with or nearly coincides with the retrieval key from the required air amount storing unit 35 by using the operation state X as the retrieval key.

For example, when it is assumed that the operation state X is 20 kW, the data numbers of No. 1 to No. 4 are extracted from the required air amount storing unit 35 (see, for example, FIG. 4). However, when the intake air temperature $T_2$ is out of the set specification T' acquired from the installation specification setting unit 33, the intake air temperature $T_2$ is excluded from a target to be extracted.

By doing this, a plurality of required amounts of air $Q_1(T_2)$ of the data number, that satisfies the installation specification T' and where the operation state x coincides with or nearly coincides with the operation state X detected by the operation state detection unit 32, are extracted in the required air amount acquisition unit 41.

Next, the process proceeds to step S15. At step S15, the exhaust air temperature estimation modeling unit 42 calculates an exhaust temperature $T_3(T_2)$ for each intake air temperature $T_2$ using the required amount of air $Q_1(T_2)$ extracted from the required air amount acquisition unit 41 and the operation state X acquired from the operation state detection unit 32. The following Equation (1) is used for the calculation, where, Cp is specific heat of the air and ρ is density of the air.

$$T_3(T_2) = Q_1(T_2) \times X \times Cp \times \rho \qquad (1)$$

However, when the operation state X is expressed by X=p/P (where, p is power consumption and P is rated power), (X×P) is used by being replaced with X of Equation (1).

Next, the process proceeds to step S16. At step S16, the outside air introduction amount ratio arithmetic unit 43 calculates the ratio of outside air introduction amount $\alpha(T_2)$ from the outside air the temperature $T_1$ obtained from the outside air temperature detection unit 31, the intake air temperature $T_2$, and the exhaust temperature $T_3(T_2)$ obtained from the exhaust air temperature estimation modeling unit 42, for each intake air temperature $T_2$. The following Equation (2) is used for the calculation.

$$\alpha(T_2) = (T_2 - T_1)/(T_3(T_2) - T_1) \qquad (2)$$

Next, the process proceeds to step S17. At step S17, the outside air introduction amount estimation modeling unit 44 estimates the outside air introduction amount $Q_2(T_2)$, for each intake air temperature $T_2$, from the required amount of air $Q_1(T_2)$ and the ratio of outside air introduction amount $\alpha(T_2)$ obtained by the outside air introduction amount ratio arithmetic unit 43 using the following Equation (3).

$$Q_2(T_2)=Q_1(T_2)\times\alpha(T_2) \tag{3}$$

Next, the process proceeds to step S18. At step S18, the target intake air temperature arithmetic unit 45 determines an intake air temperature at which the outside air introduction amount $Q_2(T_2)$ becomes the minimum among the amounts of outside air introduction $Q_2(T_2)$ obtained from the outside air introduction amount estimation modeling unit 44 and sets the determined intake air temperature as a target intake air temperature $T_2'$.

Next, the process proceeds to step S19. At step S19, the damper control unit 51 adjusts the degree of openness of the damper 17 through the damper driving unit 52 such that the detection temperature of the temperature sensor 19b (see, for example, FIG. 2) disposed in the cold aisle 22 becomes the target intake air temperature $T_2'$.

Hereinafter, descriptions will be made on a verification result of an effect of the embodiment.

(Verification 1)

A server made by Fujitsu Ltd. (eg., PRIMERGY RX 300 S7) is accommodated in the rack 13 as the electronic equipment 14. Next, the required amount of air $Q_1(T_2)$ was obtained from the specification of the server for each intake air temperature $T_2$. Further, the installation specification T' of the server is 10° C.-35° C.

Next, the required amount of air $Q_1(T_2)$ is obtained by a calculation while varying the operation state X and the intake air temperature $T_2$ of the server. The results are listed in FIG. 6 and FIG. 7.

Also, the outside air introduction amount $Q_2(T_2)$ and the circulation air amount $Q_3(T_2)$ are obtained by a calculation for a case where the operation state is 10 kW and the temperature of the outside air is 20° C. The results are listed in FIG. 8.

Further, since the required amount of air $Q_1(T_2)$ is the sum of the circulation air amount $Q_3(T_2)$ and the outside air introduction amount $Q_2(T_2)$, the outside air introduction amount $Q_2(T_2)$ is obtained as a difference between the required amount of air $Q_1(T_2)$ and the circulation air amount $Q_3(T_2)$.

Figure 9:
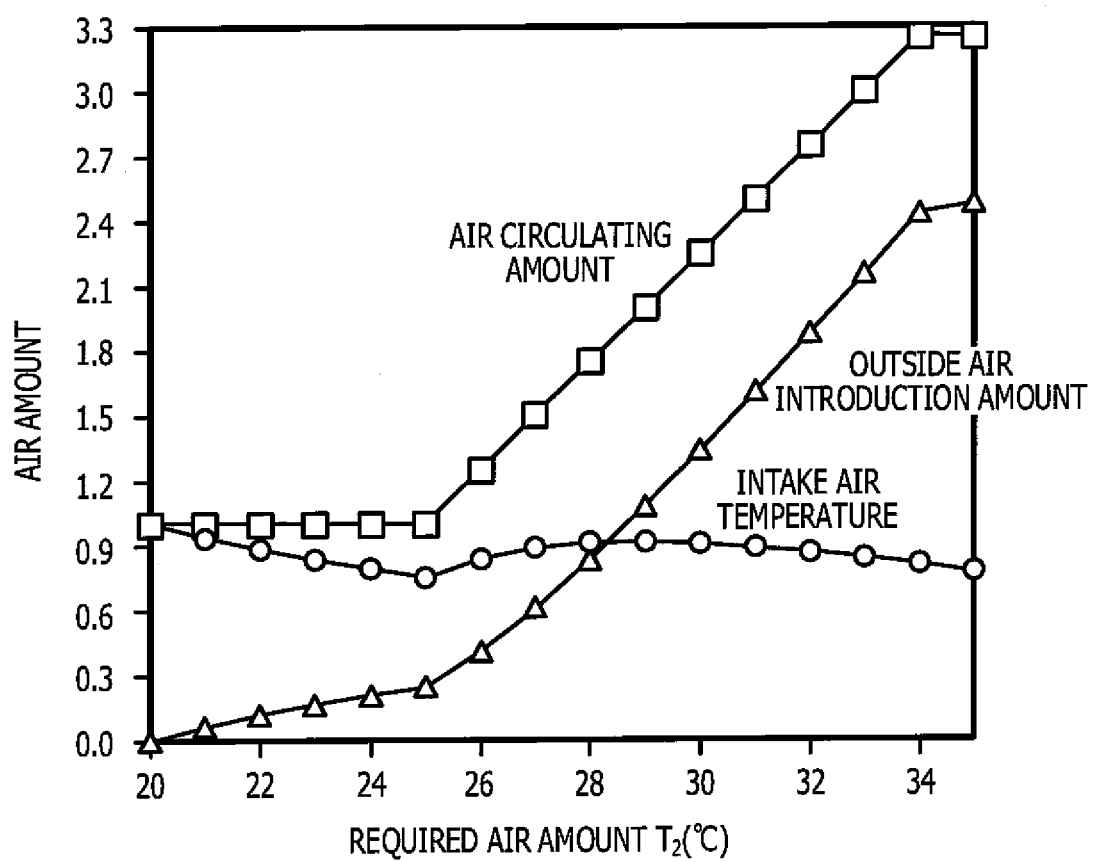
FIG. 9 is a graph illustrating results of Verification 1.

FIG. 9 is a graph illustrating a relationship between the required amount of air $Q_1(T_2)$ the circulation air amount $Q_3(T_2)$, and the outside air introduction amount $Q_2(T_2)$ for each intake air temperature $T_2$, and the intake air temperature $T_2$ and the amount of air are represented in the axis of abscissa and the axis of ordinates of the graph, respectively. However, in FIG. 9, relative values for a case where the outside air introduction amount $Q_2(T_2)$ is set to 1 when the circulation air amount $Q_2(T_2)$ is 0, are represented in the axis of ordinates.

It may be recognized from FIG. 8 and FIG. 9 that when the intake air temperature $T_2$ is 25° C., the outside air introduction amount $Q_2(T_2)$ becomes the minimum. That is, the outside air introduction amount $Q_2(T_2)$ becomes smaller in a case where the temperature of the air to be introduced into the rack 13 is 25° C. compared to a case where outside air having a temperature of 20° C. is introduced into the rack 13 as it is.

In this example, when the outside air introduction amount $Q_2(T_2)$ is set to 1 for a case where the circulation air amount $Q_2(T_2)$ is 0 (zero), that is, the outside air having a temperature of 20° C. is introduced into the rack 13 as it is, the outside air introduction amount for a case where the intake air temperature $T_2$ is set to 25° C. becomes about 0.75.

Accordingly, the case where the air having the intake air temperature $T_2$ of 25° C. is introduced into the rack 13 may cause the outside air introduction amount to be reduced by about 25% compared to that for a case where the outside air having a temperature of 20° C. is introduced into the rack 13 as it is. Accordingly, the life of the filter 18 installed in the intake port 11a becomes about one point three (1.3) times longer, that is, 1/0.75 longer, compared to the case where the outside air having a temperature of 20° C. is introduced into the rack 13 as it is.

According to the present embodiment, the life of the filter 18 extends, so that the frequency of stopping the electronic equipment 14 for cleaning or replacement of the filter 18 is reduced. Accordingly, the operating rate of the electronic equipment 14 is improved.

Further, when it is assumed that an accumulated amount of the air introduced into the rack 13 determines the life of the electronic equipment 14, the life of electronic equipment 14 extends about 1.3 times. Accordingly, the reliability of the electronic equipment 14 is improved over a long period.

(Verification 2)

A server made by Fujitsu Ltd. (e.g., PRIMERGY RX300 S7) is accommodated in the rack 13 as the electronic equipment 14. Next, the required amount of air $Q_1(T_2)$ was obtained from the specification of the server for each intake air temperature $T_2$. Further, the installation specification T' of the server is 10° C.-35° C.

Next, while maintaining the operating rate of the server is made 100% and varying the temperature of the air to be introduced into the rack 13, that is, the intake air temperature $T_2$, at the time when the temperature of the outside air $T_1$ is 17° C., the required amount of air $Q_1(T_2)$, the circulation air amount $Q_3(T_2)$, and the outside air introduction amount $Q_2(T_2)$ are measured.

Figure 10:
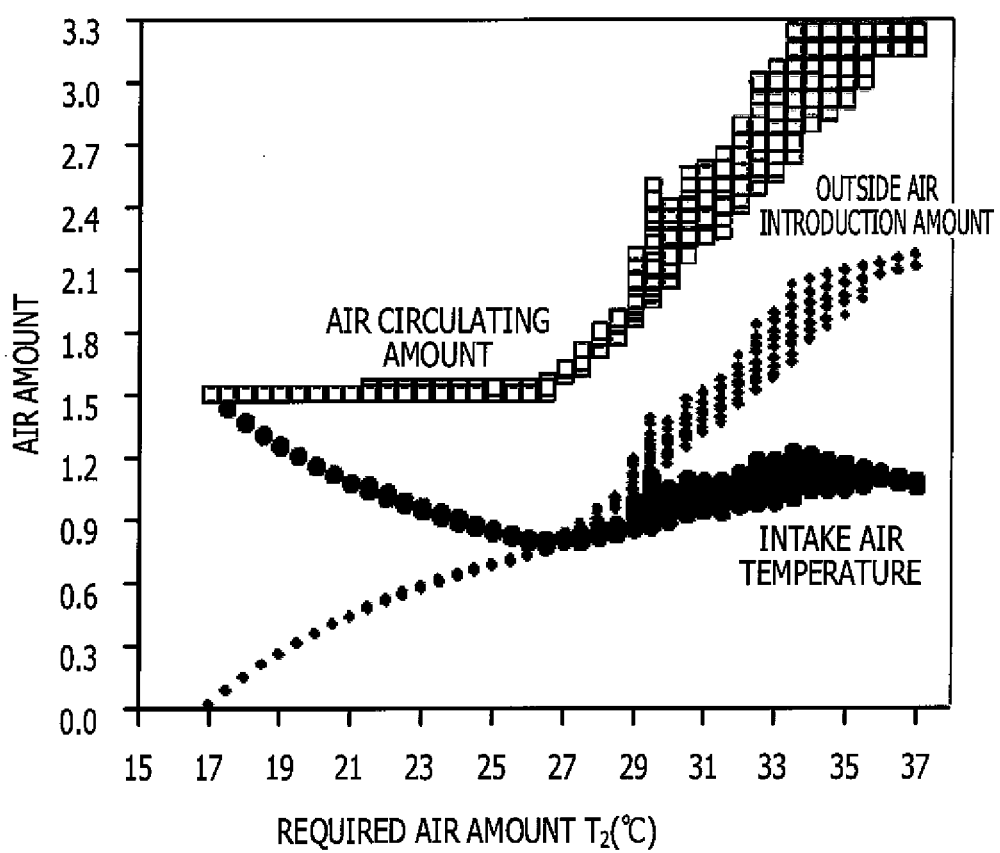
FIG. 10 is a graph illustrating results of Verification 2.

FIG. 10 is a graph illustrating a relationship between the required amount of air $Q_1(T_2)$, the circulation air amount $Q_3(T_2)$, and the outside air introduction amount $Q_2(T_2)$ for each intake air temperature $T_2$, and the intake air temperature $T_2$ and the amount of air are represented in the axis of abscissa and the axis of ordinates of the graph, respectively.

It may be recognized from FIG. 10 that when the intake air temperature $T_2$ is 27° C., the outside air introduction amount $Q_2(T_2)$ becomes the minimum. That is, the outside air introduction amount $Q_2(T_2)$ becomes smaller in a case where the temperature of the air to be introduced into the rack 13 is 27° C. compared to a case where outside air having a temperature of 17° C. is introduced into the rack 13 as it is.

In this example, when the outside air introduction amount $Q_2(T_2)$ is set to 1 for a case where the outside air having a temperature of 17° C. is introduced into the rack 13 as it is, the outside air introduction amount for a case where the intake air temperature $T_2$ is set to 27° C. becomes about 0.5. Accordingly, the case where the air having the intake air temperature $T_2$ of 27° C. is introduced into the rack 13 may cause the outside air introduction amount to be reduced by about 50% compared to that for the case where outside air having a temperature of 17° C. is introduced into the rack 13 as it is. Accordingly, the life of the filter 18 installed in the intake port 11a becomes about two times longer compared to a case where the outside air having a temperature of 17° C. is introduced into the rack 13 as it is.

According to the present embodiment, the life of the filter 18 extends, so that the frequency of stopping the electronic equipment 14 for cleaning or replacement of the filter 18 is reduced. Accordingly, the operating rate of the electronic equipment 14 is improved.

Further, when it is assumed that an accumulated amount of the air introduced into the rack 13 determines the life of the electronic equipment 14, the life of electronic equipment 14 extends about two times. Accordingly, the reliability of the electronic equipment 14 is improved over a long period.

(Second Embodiment)

Figure 11:
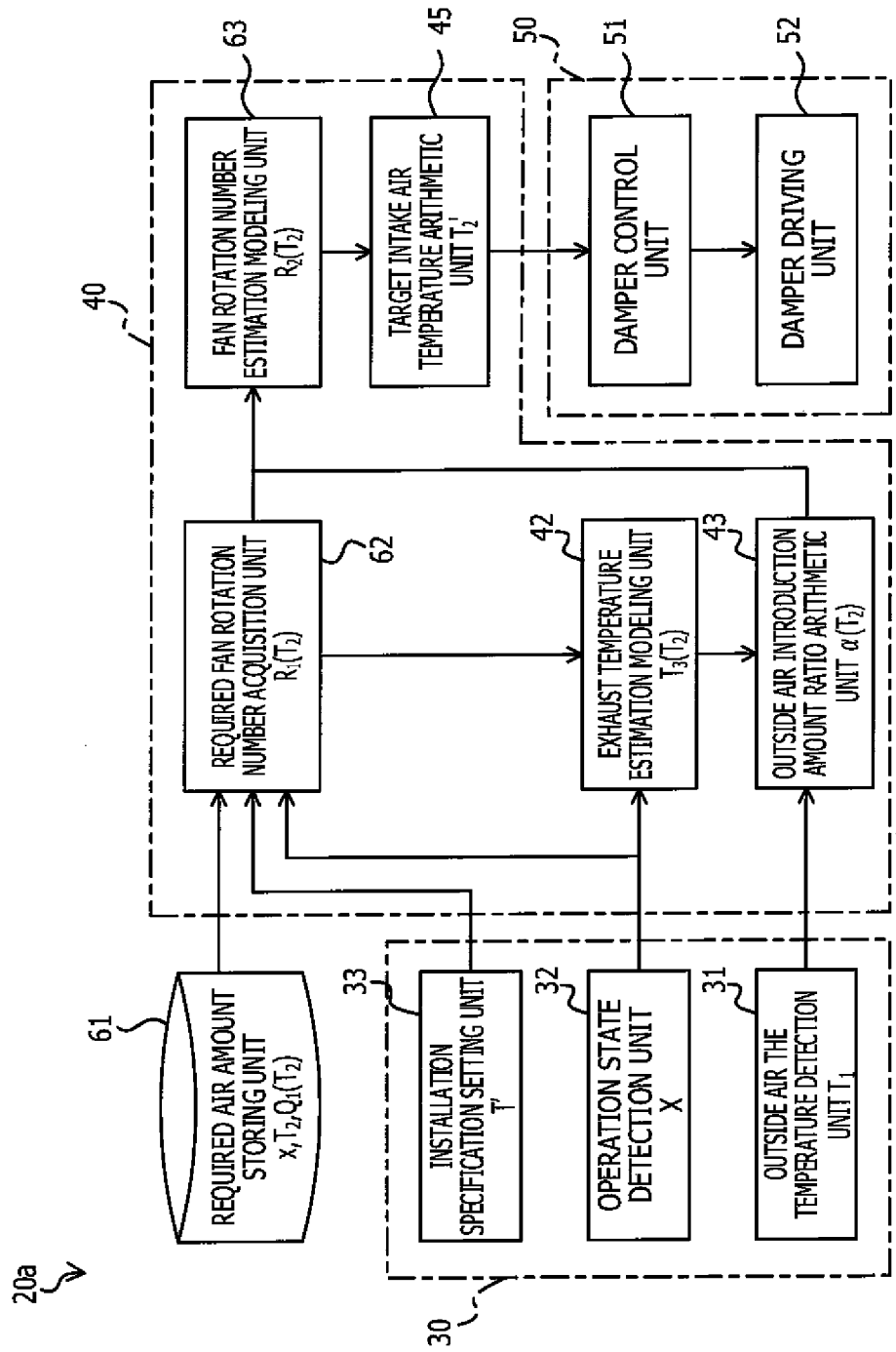
FIG. 11 is a block diagram illustrating a configuration of an air circulation amount control device of a data center according to a second embodiment.

FIG. 11 is a block diagram illustrating a configuration of an air circulation amount control device according to a second embodiment. In FIG. 11, the same constitutional elements as those of FIG. 3 are assigned with the same reference numerals and detailed descriptions thereof will be omitted. Further, descriptions will be made with reference to FIG. 1 and FIG. 2 in the present embodiment.

As illustrated in FIG. 11, the air circulation amount control device 20a of the present embodiment includes a required fan rotation number storing unit 61 as a replacement of the required air amount storing unit 35 of the first embodiment. Further, the air circulation amount control device 20a includes a required fan rotation number acquisition unit 62 as a replacement of the required air amount acquisition unit 41 of the first embodiment. Furthermore, the air circulation amount control device 20a includes the fan rotation number estimation modeling unit 63 as a replacement of the outside air introduction amount estimation modeling unit 44 of the first embodiment.

As illustrated in FIG. 12, the data related to the operation state x, the intake air temperature $T_2$, and the required number of rotation of fan $R_1(T_2)$ for each data number are stored in the required fan rotation number storing unit 61.

The required number of rotation of fan $R_1(T_2)$ is the number of rotation of the cooling fan 12a of the facility fan unit 12 required for cooling down the electronic equipment 14 within the rack 13 when the temperature of the air is $T_2$. These data may be obtained from the specifications of the facility fan unit 12 and the electronic equipment 14, or from an experiment.

The required fan rotation number acquisition unit 62 refers to the data stored in the required fan rotation number storing unit 61 to extract a plurality of data numbers that satisfies the installation specification T' and where the operation state x coincides with or nearly coincides with the operation state X detected by the operation state detection unit 32 from the data stored in the required air amount storing unit 35. The required fan rotation number acquisition unit 62 extracts respective required number of rotation of fan $R_1(T_2)$ from the data of these data number.

The exhaust air temperature estimation modeling unit 42 estimates the temperature of the air discharged from the rack 13, that is, the exhaust temperature $T_3$ ($T_2$) from the operation state X acquired from the operation state detection unit 32 and the required number of rotation of fan $R_1(T_2)$ extracted from the required fan rotation number acquisition unit 62.

The outside air introduction amount ratio arithmetic unit 43 calculates the ratio of outside air introduction amount $\alpha(T_2)$ using the temperature of the outside air $T_1$ acquired from the outside air temperature detection unit 31 and the exhaust temperature $T_3(T_2)$ acquired from the exhaust temperature estimation modeling unit 42.

The fan rotation number estimation modeling unit 63 determines the number of rotation of fan $R_2(T_2)$ from the required number of rotation of fan $R_1(T_2)$ extracted from the required fan rotation number acquisition unit 62 and the ratio of outside air introduction amount $\alpha(T_2)$ acquired from the outside air introduction amount ratio arithmetic unit 43.

The target intake air temperature arithmetic unit 45 determines the target intake air temperature $T_2'$ from the number of rotation of the fan $R_2(T_2)$ determined in the fan rotation number estimation modeling unit 63.

The damper control unit 51 of the output unit 50 adjusts the degree of openness of the damper 17 through the damper driving unit 52 so that the detection temperature of the temperature sensor 19b disposed in the cold aisle 22 becomes the target intake air temperature T'.

Hereinafter, descriptions will be made on details of an operational process of the air circulation amount control device 20a with reference to a flowchart of FIG. 13.

First of all, at step S21, the outside air temperature detection unit 31 acquires the temperature $T_1$ of outside air from the temperature sensor 19a. Further, at step S22, the operation state detection unit 32 detects the operation state X of the electronic equipment 14.

Next, the process proceeds to step S23 and the required fan rotation number acquisition unit 62 reads the installation specification T' of the electronic equipment 14 from the installation specification setting unit 33.

Next, the process proceeds to step S24 and the required fan rotation number acquisition unit 62 acquires the operation state X from the operation state detection unit 32 and extracts a data number in which the operation state x is nearest to a retrieval key from the required fan rotation number storing unit by using the operation state X as the retrieval key. However, when the intake air temperature $T_2$ is out of the set specification T' acquired from the installation specification setting unit 33, the intake air temperature $T_2$ is excluded from a target to be extracted.

For example, when it is assumed that the operation state X is 20 kW, the data numbers of No. 1 to No. 4 are extracted from the required fan rotation number storing unit 61 (see, for example, FIG. 12).

By doing this, a plurality of required numbers of rotation of fan $R_1(T_2)$ that satisfies the installation specification T' and where the operation state x coincides with or nearly coincides with the operation state X are extracted in the required fan rotation number acquisition unit 62.

Next, the process proceeds to step S25. At step S25, the exhaust air temperature estimation modeling unit 42 calculates the exhaust temperature $T_3(T_2)$ for each intake air temperature $T_2$ using the data of the required number of rotation of fan $R_1(T_2)$ acquired by the required fan rotation number acquisition unit 62 and the operation state X acquired from the operation state detection unit 32. The following Equation (4) is used for the calculation, where β is the proportional coefficient of the number of rotation of fan and the amount of air of the fan. Further, Cp is specific heat of the air and p is density of the air.

$$T_3(T_2) = \beta \times R_1(T_2) \times X \times Cp \times \rho \tag{4}$$

However, when the operation state X is expressed by X=p/P (where, p is power consumption and P is rated power), (X×P) is used by being replaced with X of Equation (4).

Next, the process proceeds to step S26. At step S26, the outside air introduction amount ratio arithmetic unit 43 calculates the ratio of outside air introduction amount $\alpha(T_2)$ from the outside air the temperature $T_1$ obtained from the outside air temperature detection unit 31, the intake air temperature $T_2$, and the exhaust temperature $T_3(T_2)$ obtained from the exhaust air temperature estimation modeling unit 42, for each intake air temperature $T_2$. The following Equation (5) is used for the calculation.

$$\alpha(T_2) = (T_2 - T_1)/(T_3(T_2) - T_1) \tag{5}$$

Next, the process proceeds to step S17. At step S17, the fan rotation number estimation modeling unit 63 estimates the number of rotation of the fan $R_2(T_2)$ at each intake air temperature $T_2$ from the required number of rotation of fan $R_1(T_2)$ and the ratio of outside air introduction amount $\alpha(T_2)$ obtained by the outside air introduction amount ratio arithmetic unit 43 using the following Equation (6).

$$R_2(T_2)=R_1(T_2)\times\alpha(T_2) \qquad (6)$$

Next, the process proceeds to step S28. At step S28, the target intake air temperature arithmetic unit 45 determines an intake air temperature at which the outside air introduction amount $Q_2(T_2)$ is at the minimum among the number of rotation of the fan $R_2(T_2)$ obtained by the fan rotation number estimation modeling unit 63, and sets the determined intake air temperature as a target intake air temperature $T_2'$.

Next, the process proceeds to step S29. At step S29, the damper control unit 51 adjusts the degree of openness of the damper 17 through the damper driving unit 52 such that the detection temperature of the temperature sensor 19b (see, for example, FIG. 2) disposed in the cold aisle 22 becomes the target intake air temperature $T_2'$.

Also in the present embodiment, similar to the first embodiment, the degree of openness of the damper 17 is adjusted according to the temperature of the outside air $T_1$ and the operation state X of the electronic equipment 14, thereby optimizing the outside air introduction amount. Accordingly, it is possible to extend the time to clean or replace the filter 18. As a result, there is an effect of improving the operating rate of the server.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A data center, comprising:
   a container that has an intake port on one side and has an exhaust port on the other side;
   a rack arranged in the container and accommodates an electronic equipment;
   a first space arranged between the rack and the intake port in the container, an outside air flows in the first space through the intake port from an outside of the container;
   a second space arranged between the rack and the exhaust port in the container, an exhaust air flows in the second space from the rack;
   a third space arranged between the rack and the first space in the container;
   air blowers arranged between the third space and the first space and introduce an air from the first space to the third space;
   a circulation passage arranged in the container and couples the first space and the second space, a part of the exhaust air flows in the circulation passage;
   a damper arranged between the circulation passage and the first space, the part of the exhaust air flows in the first space when the damper opens;
   a first temperature sensor arranged at the outside of the container and measures a temperature of the outside air;
   a second temperature sensor arranged in the third space and measures a temperature of the air introduced into the third space;
   a state detector that detects an operation state of the electronic equipment;
   a storage that stores data where the operation state and an amount of air required for cooling down the electronic equipment are associated with each other;
   a calculator that calculates a ratio of the outside air introduction amount using the data, a temperature of the outside air measured by the first temperature sensor, and a temperature of the exhaust air, and
   the calculator that calculates a target temperature of the air introduced into the third space at which an amount of the outside air introduced in the first space becomes a minimum; and
   a controller adjusts a degree of openness of the damper so that a temperature of the air measured by the second temperature sensor becomes the target temperature.

2. The data center according to claim 1, wherein the storage stores the number of rotation of the fan as data of the amount of air required for cooling down the electronic equipment.

3. The data center according to claim 1, wherein a filter is installed in the intake port.

4. The data center according to claim 1, wherein the calculator that searches for a condition where the amount of outside air to be introduced into the first space becomes the minimum according to the temperature of the outside air and the operation state of the electronic equipment.

* * * * *